(12) United States Patent
Shephard, III

(10) Patent No.: US 6,553,525 B1
(45) Date of Patent: Apr. 22, 2003

(54) METHOD AND APPARATUS FOR SELECTIVELY ENABLING AND DISABLING FUNCTIONS ON A PER ARRAY BASIS

(75) Inventor: Philip George Shephard, III, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/435,870

(22) Filed: Nov. 8, 1999

(51) Int. Cl.[7] .......................... G01R 31/28; G06F 11/00
(52) U.S. Cl. ........................ 714/733; 714/736
(58) Field of Search ................. 714/718, 719, 714/724, 733, 734, 735, 736, 738, 742, 743, 42, 5; 702/117, 118, 120

(56) References Cited

U.S. PATENT DOCUMENTS 5,301,155 A * 4/1994 Wada et al. ................. 365/201
5,416,740 A * 5/1995 Fujita et al. ................. 365/200
5,633,877 A   5/1997 Shephard, III et al. .... 371/22.2
5,796,745 A * 8/1998 Adams et al. ............... 714/718
6,061,813 A * 5/2000 Goishi ........................ 714/718

* cited by examiner

Primary Examiner—Christine T. Tu
(74) Attorney, Agent, or Firm—Duke W. Yee; Casimer K. Salys; Michael R. Nichols

(57) ABSTRACT

A method and apparatus for testing a plurality arrays on a processor with an on chip built in self test engine on the processor. A subset of the plurality arrays on the processor is selected for testing using a control mechanism to selectively enable testing of the subset. Data patterns from the on chip built in self test engine are sent to the plurality arrays on the processor. A response is received at the on chip built in self test engine from the plurality arrays. The response from the plurality arrays is compared to an expected response using the on chip built in self test engine.

21 Claims, 6 Drawing Sheets

METHOD AND APPARATUS FOR SELECTIVELY ENABLING AND DISABLING FUNCTIONS ON A PER ARRAY BASIS

BACKGROUND OF THE INVENTION

1. Technical Field

The present invention relates generally to testing integrated circuits and in particular to a method and apparatus for selectively testing arrays in an integrated circuit. Still more particularly, the present invention relates to a method and apparatus for selectively testing a given array.

2. Description of Related Art

In general, integrated circuit arrays are tested by providing a known data input at a known address to the array and comparing the output to the expected output. One well known and widely used prior art system for testing integrated circuit logic, particularly integrated circuit memory arrays, is to form a dedicated test circuit on the chip with the array itself. This circuit also is called an array built in-self test (ABIST) circuit or engine. This type of technology allows for high speed testing without having to force correspondence between the array and input/output connections to the chip itself. Random access memory on a chip, such as the memory provided for processors, are usually tested using an ABIST engine. It is increasingly common to have multiple arrays present on a chip. In testing these arrays, some arrays only need a subset of some tests that are performed on the set of arrays. Further, some tests will not work on all of the arrays. As a result, present testing mechanisms for arrays using ABIST engines may require a mechanism to disable the participation of some arrays from ABIST engines while testing others.

Also, it may be desirable to exploit the fact that ABIST engines can be used to write all the addresses in arrays, to initialize them at power on time (Power on reset). The initialization sequence requirements for various arrays may be incompatible, thereby requiring that their ABISTs be run at separate times without contaminating the contents of the arrays that were initialized by the earlier ABIST executions.

Generation and simulation of test patterns for the combinatorial logic in a digital logic chip which uses scan design is much more efficient if the effects of sequential logic (like embedded RAMs) do not have to be taken into account, therefore, it may be desirable to force known values on the outputs of one or more arrays that is independent of their contents. This behavior can also be desirable during the design debug and analysis phase for early versions of a design.

In the above mentioned environments it would be advantageous to have an improved method and apparatus for selectively enabling and disabling arrays for testing and/or design debug.

SUMMARY OF THE INVENTION

The prevent invention provides a method and apparatus for selectively enabling or disabling a plurality arrays on a processor with an on chip built in self test engine on the processor. A subset of the plurality arrays on the processor is selected for testing using a control mechanism to selectively enable testing of the subset. Data patterns from the on chip built in self test engine are sent to the plurality arrays on the processor. A response is received at the on chip built in self test engine from the plurality arrays. The response from the plurality arrays is compared to an expected response using the on chip built in self test engine.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
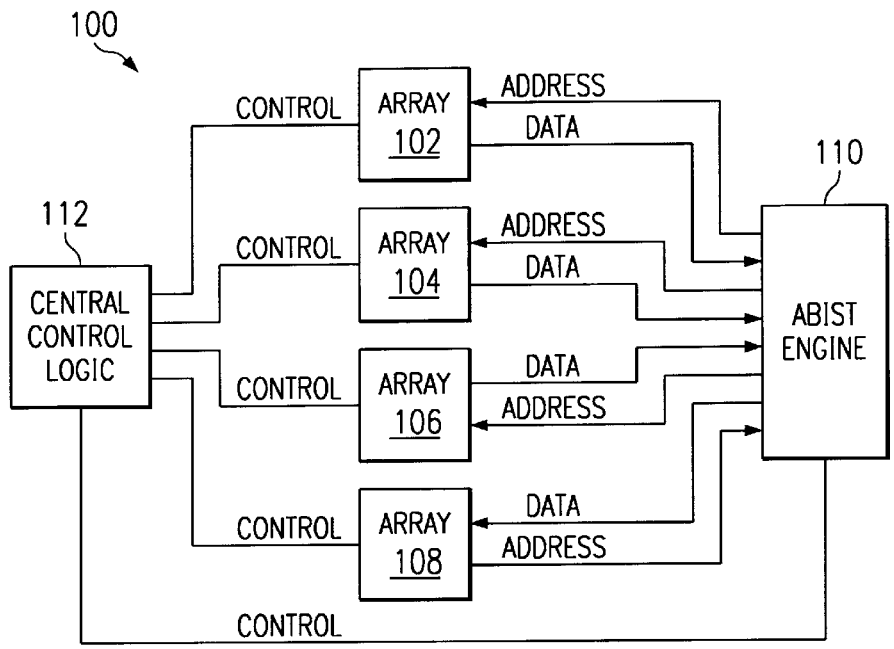
FIG. 1 is a diagram illustrating a portion of an integrated circuit chip depicted in accordance with the preferred embodiment of the present invention.

With reference now to the figures and in particular with reference to FIG. 1, a diagram illustrating a portion of an integrated circuit chip is depicted in accordance with the preferred embodiment of the present invention. In this example, region 100 in the integrated circuit chip includes a set of memory arrays, array 102, array 104, array 106, and array 108. Also within region 100, is an array built in-self test (ABIST) engine 110, which is used to generate a sequence of data patterns input and addresses input to array 102, array 104, array 106, and array 108. A data pattern is read into these arrays and then read out. Logic circuitry within ABIST engine 110 compares the data output from an array with the expected data output pattern, such as the input data pattern. ABIST engine 110 provides, for example, a pass/fail output indication for each of the arrays or for the arrays as a group depending on the particular implementation or test. Additionally, a fail address function may be implemented to identify the address at which an error occurred. Further, central controller logic 112 also includes a control connection to ABIST engine 110. This control allows the compare function, also referred to as "fail generation logic", in ABIST engine 112 to be selectively enabled and disabled. Central controller logic 112 in this example is provided to selectively enable and disable functions in the arrays. In particular, the present invention provides a method and apparatus for enabling and disabling various functions on a per array basis. For example, the gating of a write function may be selectively enabled and disabled. Additionally, forcing known values of the array outputs or degating the clock to scanable latches that catch output data also may be accomplished on a per array basis. Further, masking a result of a pass/fail detection logic for ABIST also may be performed for cases in which tests for some arrays do not make sense or will provide an erroneous result.

This set of functions provides an ability to run various ABIST tests simultaneously on differing subsets of arrays. Further, arrays can be individually selected to participate or not participate during Automatic Test Pattern Generation (ATPG) and/or before doing Logic Built in Self Test (LBIST). Further, individual arrays may be deselected from writing and having its contents being observed during system bring up and debug using the control mechanism of the present invention.

Figure 2:
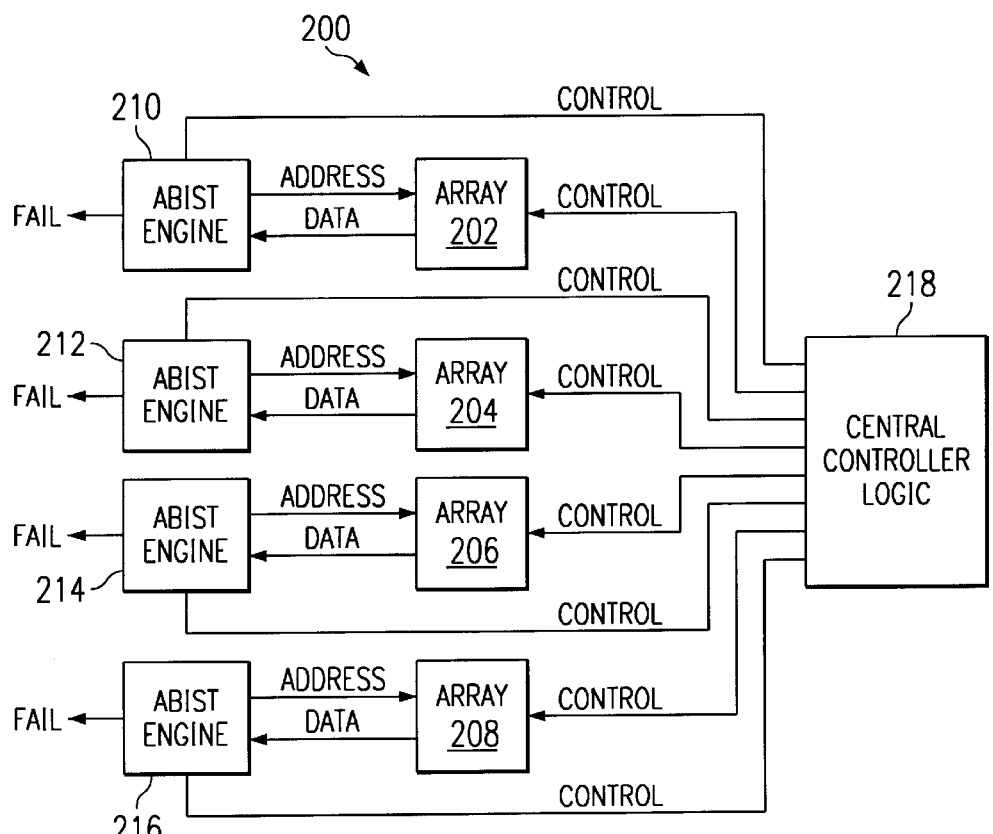
FIG. 2 is an illustration of a portion in an integrated circuit containing ABIST engines and arrays depicted in accordance with the preferred embodiment of the present invention.

With reference now to FIG. 2, an illustration of a portion in an integrated circuit containing ABIST engines and arrays is depicted in accordance with the preferred embodiment of the present invention. In this example, region 200 includes arrays 202, 204, 206, and 208. In this example, each of these arrays are individually tested by an ABIST engine, ABIST engines 210, 212, 214, and 216. Each of these ABIST engines individually produces a result based on the test on the associated array. Central controller logic 218 generates different control signals to selectively enable and disable arrays 202, 204, 206, and 208 for the different tests. Central controller logic 218 also has connections to ABIST engines 210, 212, 214, and 216. These connections are used to selectively enable and disable fail generation logic in the ABIST engines.

In addition, the illustration of the components in FIGS. 1 and 2 are not meant to indicate architectural limitations to the mechanism of the present invention. For example, although only four arrays are illustrated, more or less arrays may be used depending on the particular implementation. Additionally, central controller logic is illustrated as being separate from ABIST engine 110 in FIG. 1 and ABIST engines 210, 212, 214, and 216 in FIG. 2. These diagrams are only for purposes of illustrating the features of the present invention. Of course, central controller logic shown in FIGS. 1 and 2 also could be integrated within the ABIST engines.

Figure 3:
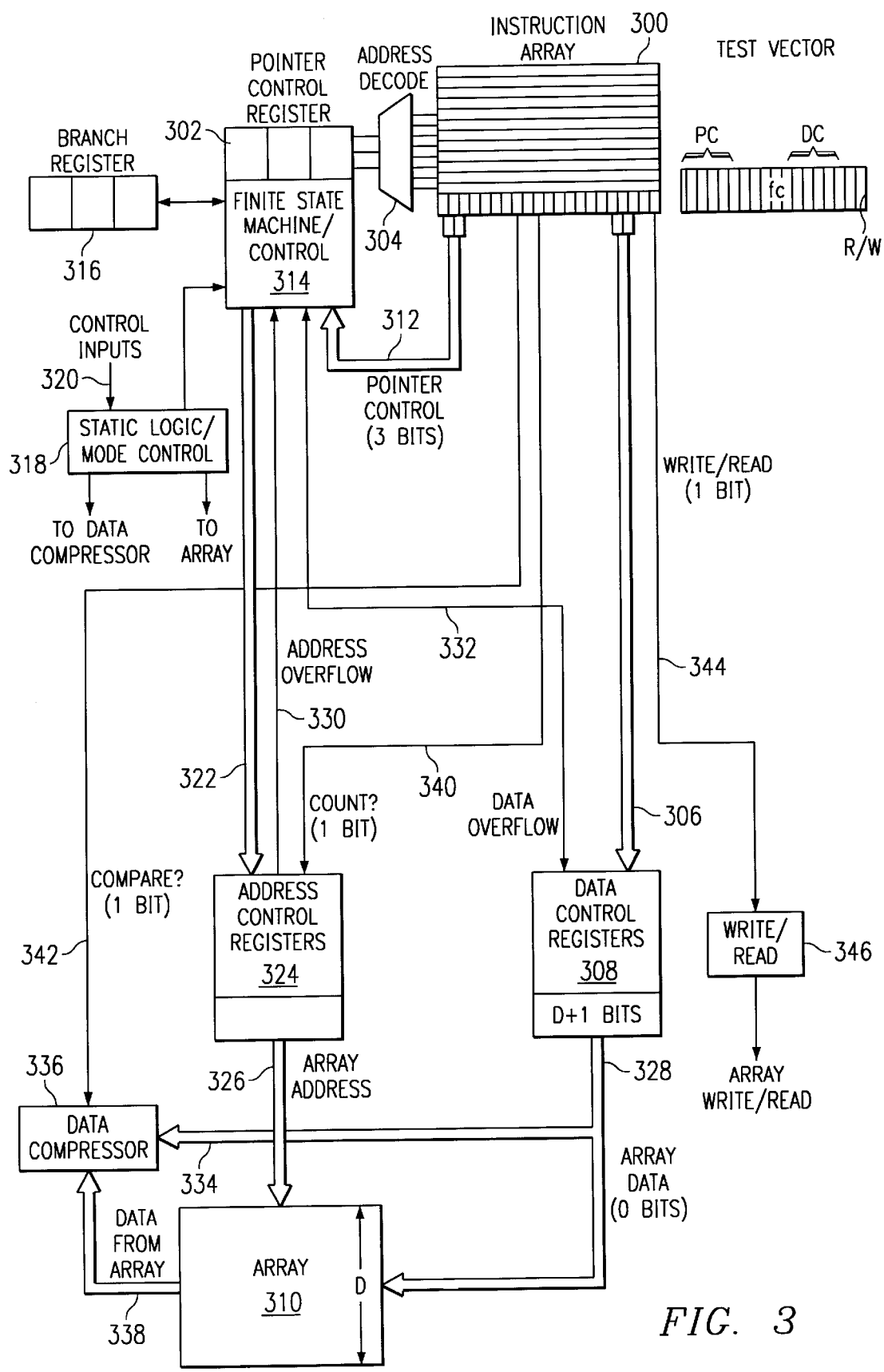
FIG. 3 is a diagram of an ABIST engine with an associated array depicted in accordance with the preferred embodiment of the present invention.

With reference now to FIG. 3, a diagram of an ABIST engine with an associated array is depicted in accordance with the preferred embodiment of the present invention. This figure illustrates a programmable ABIST engine, such as ABIST engine 110 in FIG. 1 or ABIST engine 210 in FIG. 2.

In this example, an instruction array 300 along with pointer control register 302 form a programmable state sequencer. Address decoder 304 couples pointer control register 302 to instruction array 300. During each cycle, one instruction register within instruction array 300 may be selected by pointer control register 302 and the contents of the register being read out and being used to determine the action being taken. In these examples, the actions may include, for example, sending signals to other test elements or altering the contents of pointer control register 302. For example, the alteration to pointer control register 302 may be to increment the pointer, decrement the pointer, hold the current pointer value, reset the pointer to zero, or change the pointer to the value contained in a branch register.

In these examples, instructions within instruction array 300 include five fields: a three bit pointer control field PC, a one bit failed address function control field f, a one bit address count control field c, a three bit control field DC, and a one bit read/write control field R/W.

A bus 306 couples the three bit data control field from a register selected by the pointer in pointer control register 302 to a data control register 308. In this example, data control register is D+1 bits where d is equal to the width of array 310. Bus 312 couples instruction array 300 to finite state control logic 314, which loads pointer control register 302 with an address specified by the pointer control field. Alternatively, finite state control logic 314 may load the contents of branch register 316 into pointer control register 302 when the pointer control field specifies a branch on a register operation.

A static/mode control 318 is coupled to state control logic 314 to enable or disable the programmable ABIST in response to an external control input 320. These external control signals applied to external control input 320 include control signals used to selectively enable and disable various functions in array 310 and data compressor 336. For example, write and read functions may be controlled as well as failed generation logic within data compressor 336.

Bus 322 couples the address sequencing instruction from state control logic 314 to an address control register 324. Further, buses 326 and 328 respectively couple the output of address control register 324 and data control register 308 to array 310. Buses 330 and 332 respectively couple the address overflow state of address control register 324 and the data overflow state of data control register 30B to state control logic 314. Bus 334 couples data read into array 310 to a suitable data compressor 336 in which the data is compared to data with data on bus 338 read from array 310. Data compressor 336 is used to produce an indication of whether the test passed or failed in this example. Further, data compressor 336 can also include circuitry to identify an address of a failed data output.

Bus 340 couples the one bit address count control field from instruction array 300 to address control register 324 to enable or inhibit the change of address depending on the state of the address count control field. Bus 342 couples the one bit failed address function control signal from instruction array 300 to enable or disable a failed function address within data compressor 336. Bus 344 couples instruction array 300 to read/write register 346 and sends the one bit read/write control field into read/write register 346. This field is used to control the read/write of array 310 in this example.

More information on the details of the registers and operation of the ABIST engine may be found in the U.S. Pat. No. 5,633,877, which is incorporated herein by reference.

Figure 4:
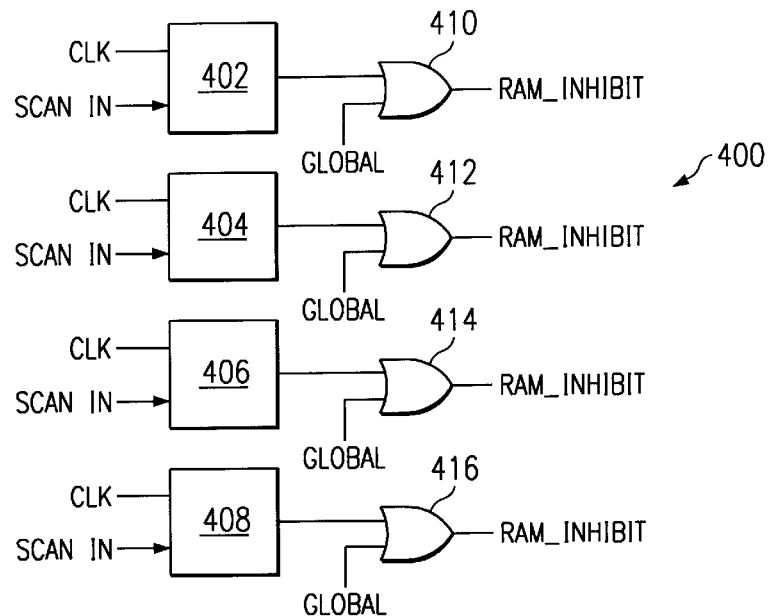
FIG. 4 is a block diagram illustrating a central controller logic unit depicted in accordance with the preferred embodiment of the present invention.

With reference now to FIG. 4, a block diagram illustrating a central controller logic unit is depicted in accordance with the preferred embodiment of the present invention. The central controller logic unit 400 may be implemented as central controller logic 112 in FIG. 1 or central controller logic 218 in FIG. 2. Central controller logic 112 may supply control inputs to control input 320 in FIG. 3. Alternatively, depending on the implementation central controller logic unit 400 also may be located within static logic/mode control 318 in FIG. 3.

In this example, central controller logic contains shift register latches 402, 404, 406, and 408. Each of these shift register latches has an input for a clock to drive the register as well as a scan in input for loading values into the register. The output of shift register latches 402, 404, 406, and 408 are coupled to the input of OR gates 410, 412, 414, and 416 respectively. Additionally, a global signal from a single source is also coupled to a second input of OR gates 410, 412, 414, and 416. The output of OR gates 410, 412, 414, and 416 generate ram_inhibit signals and are coupled to different arrays in these examples. Based on the values set in shift register latches 402, 404, 406, and 408, different values for ram_inhibit signals may be generated. Further, if the input coupled to the global signal is a logic 1 all of the OR gates will generate a logic 1 for the ram_inhibit signal.

For example, the signal generated by OR gates 410, 412, 414, and 416 may be coupled to arrays 102, 104, 106, and 108 in FIG. 1 or arrays 202, 204, 206, and 208 in FIG. 2 to selectively enable and disable certain inputs and outputs or other components associated with the arrays. For example, the ram_inhibit signals may be generated such that only one array is selected. Alternatively, other numbers of arrays may be selected, including all of the arrays. The selection of the arrays are controlled by the data scanned into shift register latches 402, 404, 406, and 408. In this manner, central controller logic unit 400 may be used to select subsets of arrays.

The components illustrated in central controller logic unit 400 are for purposes of explaining one exemplary mechanism of the present invention and are not intended to limit the architecture in which signals controlling the selection of arrays may be generated. For example, other numbers of shift registers may be used or other logic units may be used to store and generate the control signals.

FIGS. 5–9 below illustrate example uses of the ram_inhibit signals generated by a central controller logic unit to enable or disable functions in an array. In the depicted examples, the functions enabled or disabled involve reading and writing data in an array.

Figure 5:
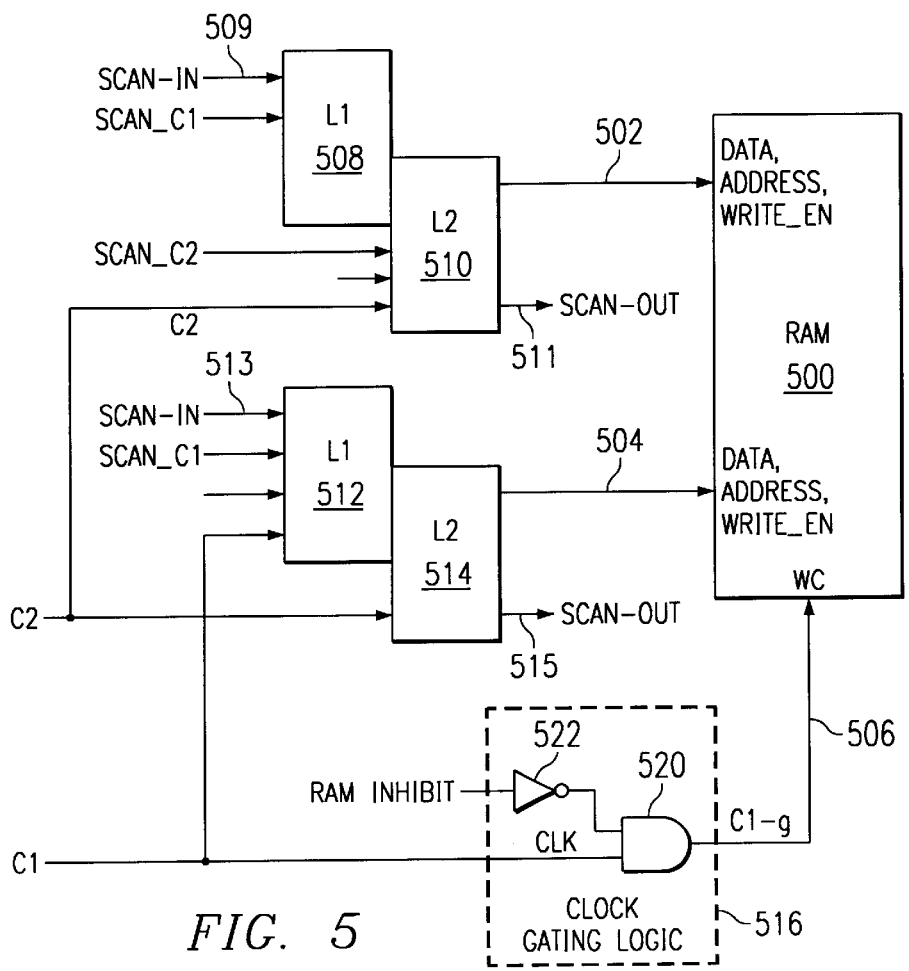
FIG. 5 is a diagram illustrating a write path in an array that may be selectively enabled and disabled depicted in accordance with the preferred embodiment of the present invention.

With reference now to FIG. 5, a diagram illustrating an array write path that may be selectively enabled and disabled is depicted in accordance with the preferred embodiment of the present invention. In this example, random access memory (RAM) 500 includes an input 502 at which data, addresses, and write enable signals are received. Additionally, input 504 in RAM 500 is used to received data, addresses, and write enable signals. Input 506 is used to receive a clocking signal c1.

Clock signals and data are received at shift register latches (SRLs) 508, 510, 512, and 514 in these examples. The output of SRL 508 is connected to an input of SRL 510. Further, data may be scanned into SRL 508 at input 509 and data placed into SRL 510 may be scanned out at output 511 in these examples. Similarly, the output of SRL 512 is connected to the input of SRL 514. SRL 512 contains an input 513 through which data may be scanned in to SRL 512. Data in SRL 514 also may be scanned out at output 515. Input 509 and input 513 allow for values to be set in RAM 500, which may be different then those in other arrays. The illustrated shift register latches may be used to scan in data and addresses. These SRLs are clocked using clock signals scan_c1, scan_c2, c2, and c1.

Additionally, scanned clock scan_c1 is input into SRL 508 while scan clock scan_c2 is input into SRL 510. A clock signal c2 is input into SRL 510. SRL 512 also receives clock signal scan_c1 as well as a clock signal c1u. SRL 514 receives a clock signal c2 in this example. The clock signals c1 and c2 are used to lock the SRLs.

The enabling or disabling of writing to RAM 500 is controlled by clock gating logic 516 in these examples. When a not ram_inhibit signal is applied to clock gating logic 516 no clock signal will be generated or applied to input 506 in RAM 500. The not ram_inhibit signal has an opposite logic value of the ram_inhibit signal and is indicated using a "/" in the diagrams.

As a result, any writes attempted to RAM 500 will not occur because a clock signal is not present to allow data to be written.

Clock gating logic 516 includes an AND gate 520, an inverter 522, in this example. A ram_inhibit is applied to inverter 522, creating a /ram_inhibit signal. In this example, the inputs into AND gate 520 are /ram_inhibit and a clock signal c1.

The output of AND gate 520 outputs a clock signal c1_g, depending on the inputs into AND gate 520. For example, if the ram_inhibit signal is a logic "1" at any time, clock signal c1_g will not be generated at the output of clock gating logic 516 by AND gate 520. In this manner, the write function for RAM 500 may be selectively enabled and disabled. Clock gating logic 516 in this example is implemented using an AND gate and an inverter for purposes of illustrating the mechanism of the present invention. Clock gating logic 516 may include other logic elements used in controlling the clock signal applied to input 506. For example, it may be desirable sometimes to stop the clock for other purposes than those associated with selectively enabling and disabling individual arrays in a group of arrays. Additional logic elements may be added to incorporate this feature within clock gating logic 516.

Figure 6:
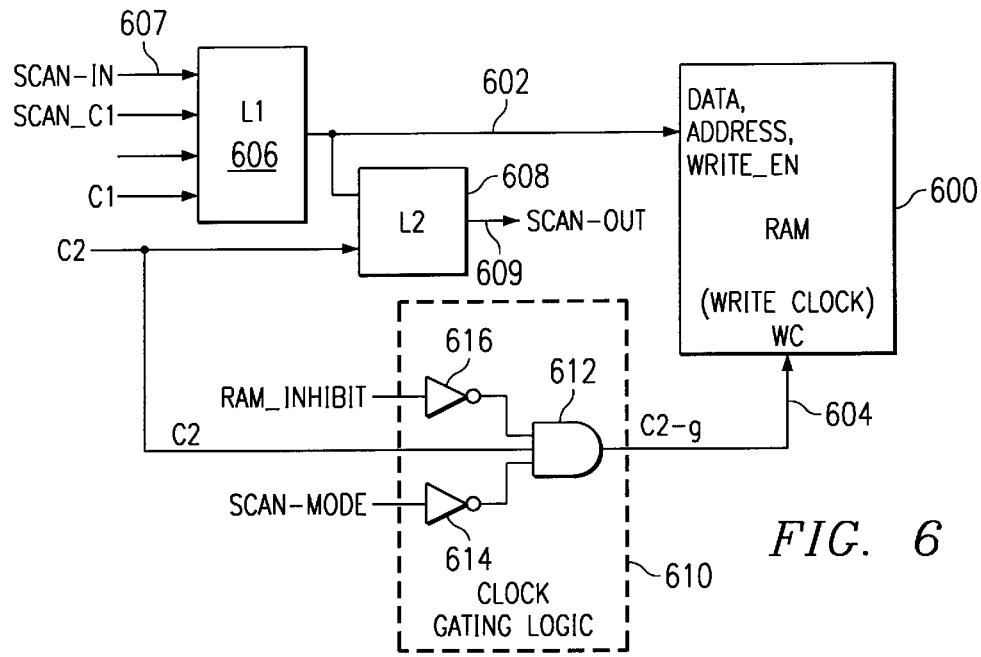
FIG. 6 is a diagram illustrating a write path in an array that may be selectively enabled and disabled depicted in accordance with the preferred embodiment of the present invention.

With reference now to FIG. 6 a diagram of a write path for a RAM that may be selectively enabled and disabled is depicted in accordance with a preferred embodiment of the present invention. RAM 600 in this example includes an input 602, which is used to receive data, addresses, and write enable signals. The clock signal used to clock the data to be written into RAM 600 is received at input 604. Data in this example is input into input 602 in RAM 600 through SRLs 606 and 608. In particular, the output of SRL 606 is connected to input 602 in RAM 600. The output of SRL 606 is also connected to the input of SRL 608.

In this example, SRL 606 may be used to receive scanned in data at input 607 as well as other data. Output 609 in SRL 608 is used to scan out data loaded into SRL 606. SRL 606 is driven by clock c1 while SRL 608 is driven by clock c2. The write clock signal applied to input 604 also is a clock c2 signal, which is controlled by clock gating logic 610 in these examples. When the /ram_inhibit signal is asserted, the clock signal c2 is absent from the output of clock gating logic 610. Clock gating logic is implemented using an AND gate 612, an inverter 614 and an inverter 616. A scan_mode signal is applied to inverter 614 to generate a /scan_mode signal. AND gate 612 receives the /ram_inhibit signal, the /scan_mode signal, and the clock signal c2 as inputs to selectively generate a clock signal c2_g. As a result, without the write clock being applied to RAM 600, data cannot be written into RAM 600. By selectively asserting the ram_inhibit signal, writes to RAM 600 may be selectively enabled and disabled.

Figure 7:
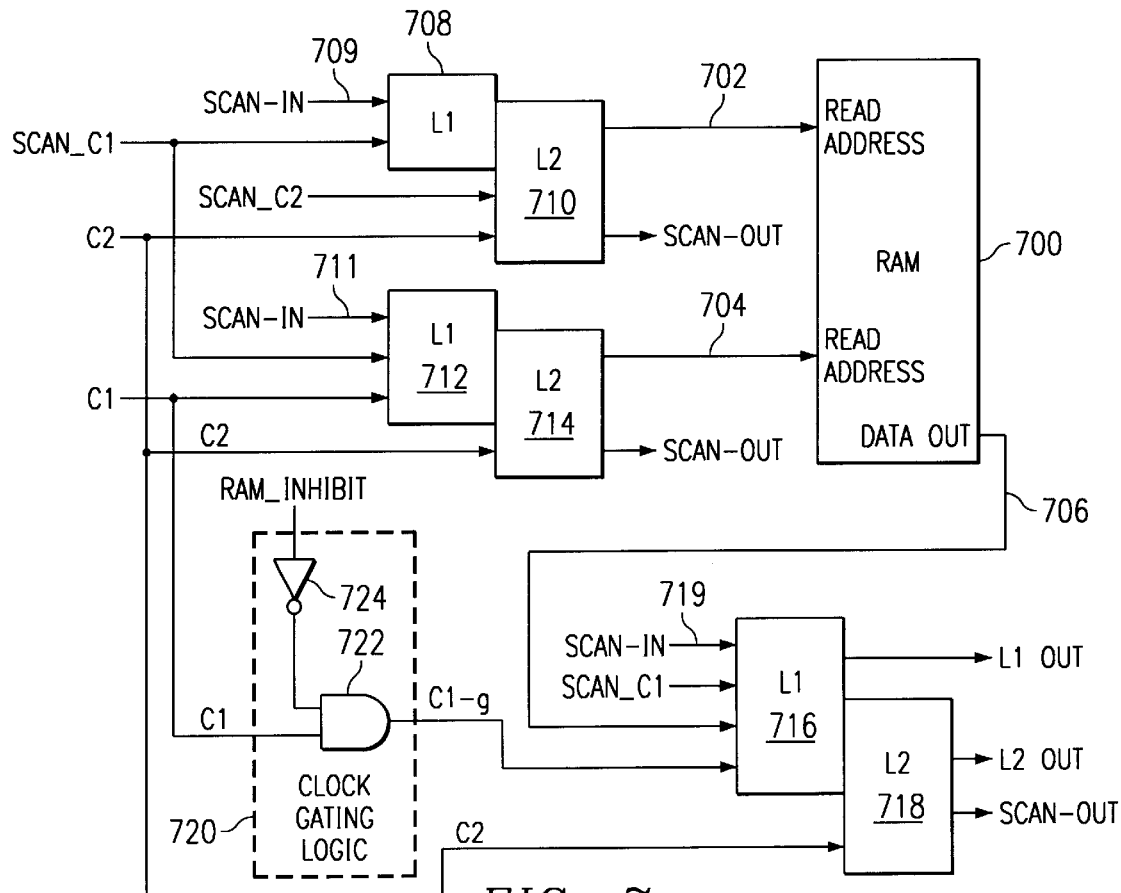
FIG. 7 is a block diagram of a read path in a random access memory that may be selectively enabled and disabled depicted in accordance with the preferred embodiment of the present invention.

With reference now to FIG. 7, a block diagram of a read path in a random access memory that may be selectively enabled and disabled is depicted in accordance with the preferred embodiment of the present invention. This example illustrates selective enabling and disabling of capturing the output data from a RAM 700.

In this example, RAM 700 receives addresses to be read at inputs 702 and 704. The actual data read from the addresses are output at output 706 in this example. SRLs 708, 710, 712, and 714 may be used to scan in and send addresses to inputs 702 and 704. Values may be scanned in at inputs 709 and 711 to force or set desired values within RAM 700. Data read out of output 706 is read out using a combination of latches 716 and 718. Additionally, SRL 716 provides for the output for data. Additionally, a clock gating logic 720 is used to control the clock signal for SRL 716. Specifically, clock signal c1 is controlled by clock gating logic 720, which contains an AND gate 722 and an inverter 724. Clock gating logic 720 generates clock signal c1_g, which is applied to SRL 716. If the ram_inhibit is active, a logic "1", SRL 716 will not capture the output data from RAM 700 because the clock signals to these SRLs will be inactive.

In addition to degating or disabling the clock signal, a known value may be scanned into SRLs 716 and 718 through input 719. In this manner, a known value may be scanned in such that the actual result of a read from RAM 700 may be ignored. This can be desirable for debug of a design in hardware, where the contents of the RAM are incorrect due to a design error. In such a case, a known result that does not cause a failure may be placed into SRLs 716 and 718 by scanning them via the LSSD scan path. This mode of operation can also be useful during logic testing since it allows the test patterns for the logic to be independent of the contents of the RAM, thereby eliminating the need to initialize the RAM to a known state during ATPG or before performing LBIST.

Figure 8:
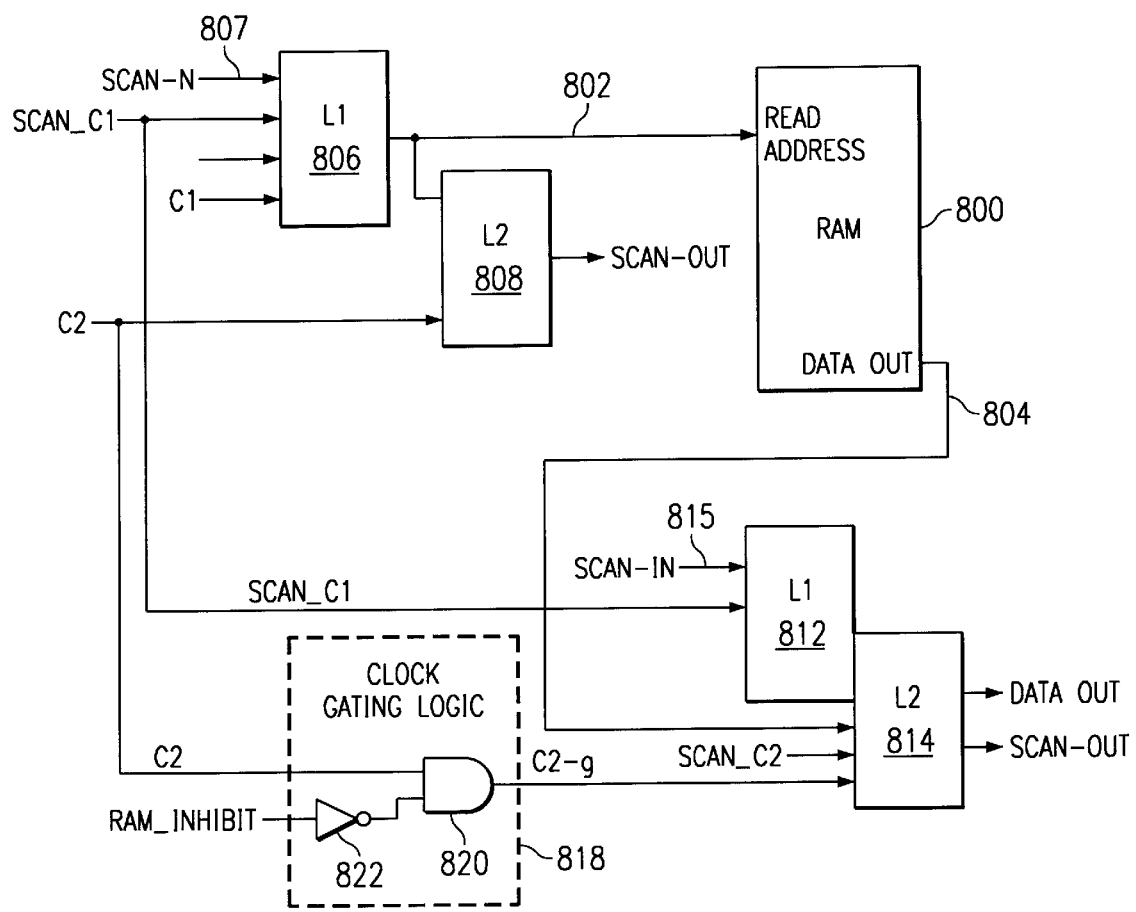
FIG. 8 is a diagram illustrating a read path that may be selectively enabled and disabled depicted in accordance with a preferred embodiment of the present invention.

With reference now to FIG. 8, a diagram illustrating a read path that may be selectively enabled and disabled is depicted in accordance with a preferred embodiment of the present invention. This example illustrates selectively turning on and turning off a read function using a ram_inhibit signal. RAM 800 includes an input 802 to receive read addresses. Output 804 is used to output data in response to addresses sent into RAM 800. These addresses may be sent into RAM 800 through SRL 806. An address may be scanned into SRL 806 through input 807 and input into input 802. In this manner, a desired value may be placed into RAM 800. The clocking of the information from SRL 806 into input 802 is controlled by clock signals scan_c1 and clock c1. SRL 808 has its input for data connected to the output of SRL 806. The data for SRL 808 is clocked using clock signal c2 and the output is scanned out data.

SRLs 812 and 814 are used to output data from the array. The output of output 804 is connected to SRL 814. Input 815 in SRL 812 may be used to scan in data to preset the output for RAM 800. This mode of operation can also be useful during logic testing since it allows the test patterns for the logic to be independent of the contents of the RAM, thereby eliminating the need to initialize the RAM to a known state during ATPG or before performing LBIST. The clocking of data scanned into SRL 812 is controlled by scan_c1. The data output by SRL 814 from RAM 800 is clocked using clock signal c2_g. This clock signal is controlled using clock gating logic 818, containing an AND gate 820 and an inverter 822. When the ram_inhibit signal is active, the data output by SRL 814 is held because no clock signal is enabled for this particular latch.

As with the latches illustrated in FIG. 7, latches 812 and 814 may have known values scanned in to provide an expected result.

Figure 9:
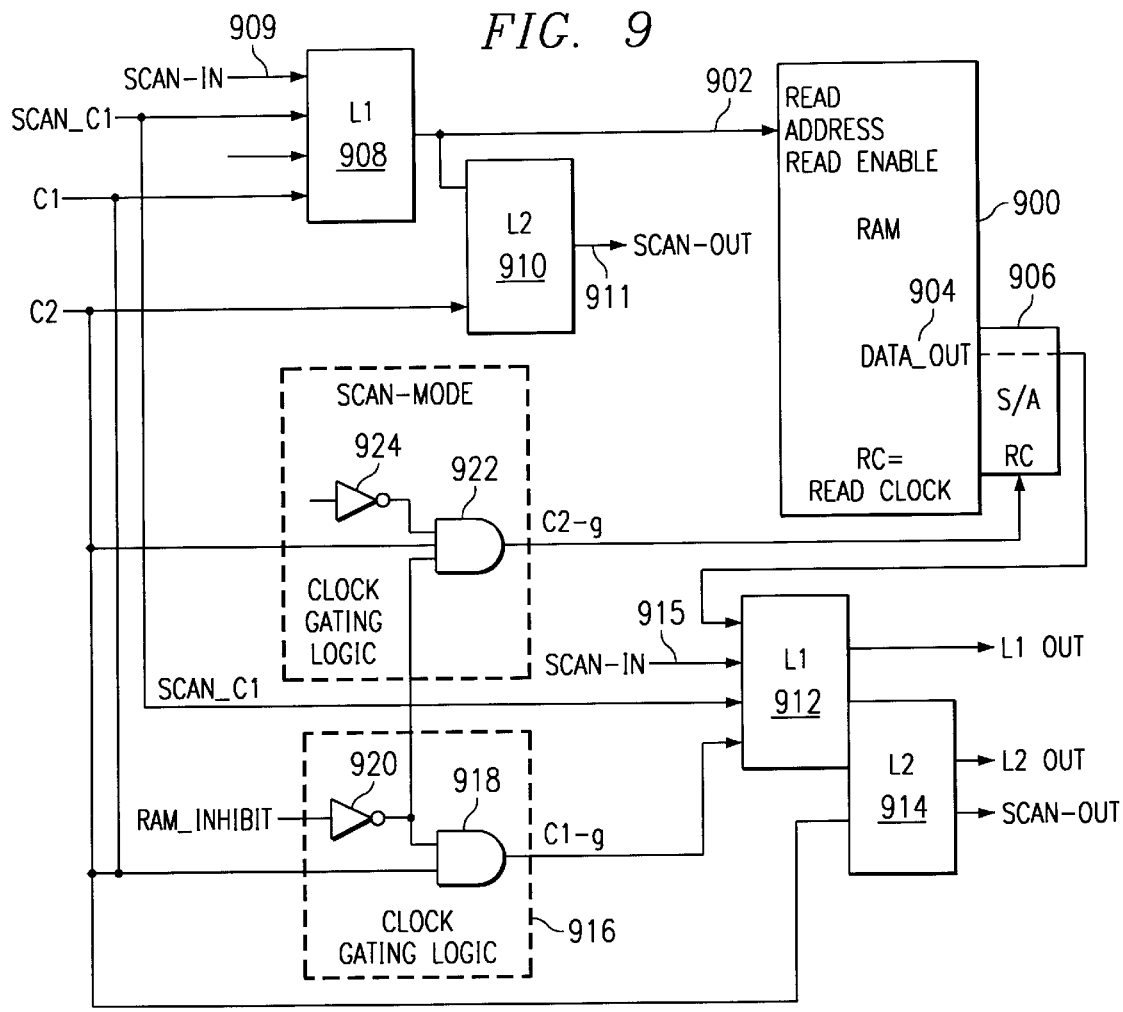
FIG. 9 is a diagram illustrating a read path that may be selectively enabled and disabled depicted in accordance with a preferred embodiment of the present invention.

With reference now to FIG. 9, a diagram illustrating a read path that may be selectively enabled and disabled is depicted in accordance with a preferred embodiment of the present invention. RAM 900 includes an input 902, which is used to receive a read address and a read enable signal. Data is output through output 904 into a sense amplifier 906, which is clocked using a clock signal c2. Read addresses and read enable signals are received from SRL 908. Known values may be scanned into input 909 to set values within RAM 900. The output of SRL 908 is also connected to the input of SRL 910. Output 911 in SRL 910 may be used to scan out data scanned into SRL 908.

SRL 908 is clocked by clock signal c1 while SRL 910 is clocked by clock signal c2. The signal scan_c1 is used to enable data to be scanned into SRL 908. Data is output using SRLs 912 and 914 in these examples. The output of sense amplifier 906 is connected to the input of SRL 912. Data may be read from the output of SRL 912. Further, the output of SRL 912 is connected to the input of SRL 914. SRL 912 is clocked by clock signal c1_g while SRL 914 is clocked by clock signal c2 in this example. Additionally, data may be scanned into input 915 in SRL 912 on the scan_c1 signal is active. SRL 914 may be used to scan out data from SRL 912.

Data that can be read from SRL 914 is controlled by clock gating logic 916 in these examples. Clock gating logic 916 contains an AND gate 918 and an inverter 920. Clock gating logic 916 receives a ram_inhibit signal and a clock signal CLK. When ram_inhibit is asserted, no clock signals are generated for SRLs 912. As a result, data on the outputs of RAM 900 is not observed when the ram_inhibit signal is applied to clock gating logic 916.

SRLs 912 and 914 also may be set with known values that can be scanned into SRL 912 through input 915. In this manner, known values may be placed into these latches during or before testing of an array. This mode of operation can also be useful during logic testing since it allows the test patterns for the logic to be independent of the contents of the RAM, thereby eliminating the need to initialize the RAM to a known state during ATPG or before performing LBIST.

The clock for sense amplifier latch 906 can be gated or ungated. It may be desirable to use a gated clock in the case where the clock for the sense amplifier is derived from the write clock for the array, and the write clock is gated as described in FIG. 6. Specifically, gating of the clock signal is performed using clock signal c2_g, which is generated by clock gating logic 922, which includes AND gate 924 and inverter 926, which is the same clock gating logic structure as clock gating logic 610 in FIG. 6. Inputs into AND gate 924 include a /ram_inhibit generated from the output of inverter 920, clock signal c2, and a /scan_mode signal generated by inverter 924. The scan_mode signal applied to inverter 924 is used to place the system into a mode to scan data into or out of RAM 900.

Figure 10:
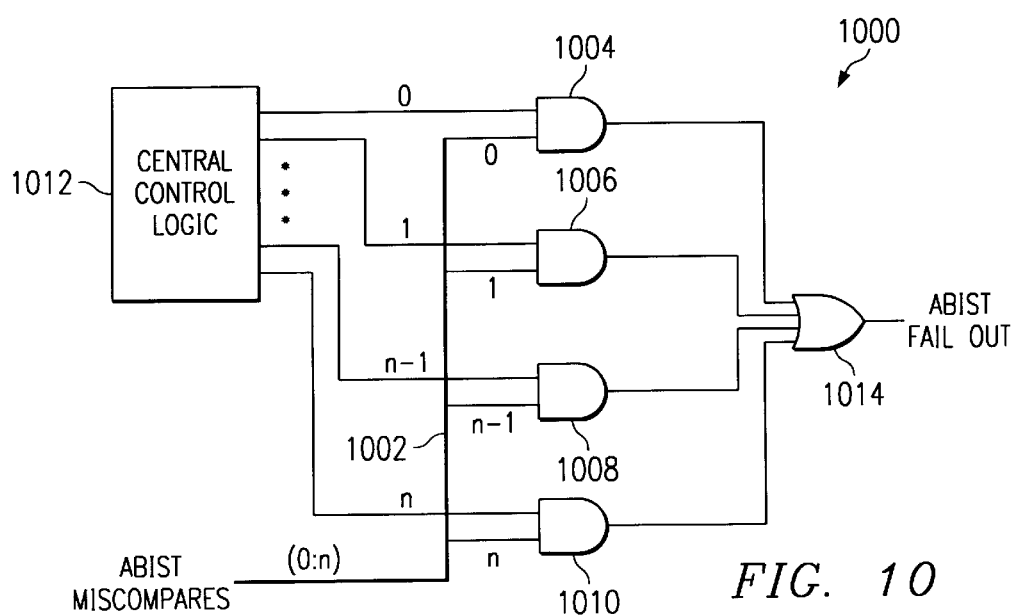
FIG. 10 is a diagram of a fail generation logic depicted in accordance with a preferred embodiment of the present invention.

With reference now to FIG. 10, a diagram of a fail generation logic is depicted in accordance with a preferred embodiment of the present invention. Fail generation logic 1000 is an example of circuitry that may be implemented within a data compressor, such as data compressor 336 in FIG. 3. Alternatively, fail generation logic 1000 may be connected to the output of a number of data compressors for different ABIST engines. In this example, the results of a comparison in an ABIST test for different arrays is sent from bus 1002 to the inputs of AND gates 1004, 1006, 1008, and 1010. Mask register 1012 provides data that is input into AND gates 1004, 1006, 1008, and 1010. The data output by central controller logic 1012 are ram_inhibit signals generated, such as those illustrated in FIG. 4. The output of AND gates 1004, 1006, 1008, and 1010 are input into OR gate 1014. The output of OR gate 1014 is referred to as an ABIST fail out signal, which indicates whether a failure has occurred in any of the arrays selected for testing through mask register 1012. Array selected for testing through mask register 1012 will have a logic "1" set for the portion of the register associated with the AND gate for the array. Thus, if the input to an AND gate is a logic "0" the AND gate will not generate a "1" even if a test failure has occurred. In this manner, test may be performed on all of the arrays with only a subset of the arrays being selected when the results are examined.

Thus, the present invention provides a mechanism for selectively enabling and disabling functions on a per array basis. In particular, mechanism of the present invention provides an integrated solution to selectively disable writing data into arrays, observing the output of arrays, and observing ABIST results. Observing the output means that the output from an array can be detected while capturing the output means that the latches capturing the array output hold their states so that the values can be detected. Preventing data form being observed means that data can be preset at the outputs of the array. The preventing data from being observed may be accomplished by forcing the output of the array to a known state or preventing data from being captured from the array. Preventing data from being captured means that the latches hold values scanned into them rather than the values generated by the array.

The figures illustrate structures for the selection of arrays for use with an ABIST engine as well as logic testing and design debug and analysis. The examples illustrate selectively enabling and disabling a write function through the control of the write clock for an array, such as a RAM. In addition, known values may be scanned into the array output latches while the clock for the latches capturing the output data may be degated or disabled. This prevents observing the contents of the array. Further, the result of a pass/fail test may be selectively masked in the detection logic for an ABIST engine.

Through controls, such as those described above, the mechanism of the present invention allows for various ABIST test to be run simultaneously on different subsets of arrays. In this manner, arrays can be individually selected to participate in a test and/or during power on reset initialization. This mechanism also allows for individual arrays to be deselected for writing and observation during logic testing, as well as during system bring up and debug.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A built-in on-chip test system comprising:
a set of arrays having input ports and data output ports;
a test logic connected to the set of arrays, wherein the test logic tests the set of arrays by sending test data into the input ports to access the set of arrays, wherein results are generated at the data output ports of the set of arrays and comparing the results from the set of arrays to an expected result for the set of arrays; and a control logic connected to the set of arrays, wherein the control logic selectively enables testing of selected arrays within the set of arrays using test data corresponding to the selected arrays.

2. The built-in on-chip test system of claim 1, wherein the sending of test data into the input ports involves writing data into the set of arrays and reading data from the set of arrays.

3. The built-in on-chip test system of claim 1, wherein the control logic selectively disables write operations on the input ports of an array within the set of arrays.

4. The built-in on-chip test system of claim 1, wherein the control logic selectively disables observing data output ports on an array within the set of arrays.

5. The built-in on-chip test system of claim 1, wherein the test logic includes compare logic to compare the results from the set of arrays to an expected result for the set of arrays and wherein control logic selectively disables a comparison of a result from an array in the set of arrays with the expected result for the set of arrays.

6. The built-in on-chip test system of claim 1, wherein the test logic is an array built in self test engine.

7. A built-in on-chip test system comprising:
a set of arrays having input ports and data output ports;
a test logic connected to the set of arrays, wherein the test logic tests the set of arrays by sending test data into the input ports to access the set of arrays, wherein results are generated at the data output ports of the set of arrays and comparing the results from the set of arrays to an expected result for the set of arrays; and a control logic connected to the set of arrays, wherein the control logic selectively enables testing of selected arrays within the set of arrays, wherein the built-in on-chip test system includes an array built in self test engine comprising:
a data control register for generating and applying deterministic data patterns to the data input ports of each array within the set of arrays;
an address control register for generating addresses for application to each array within the set of arrays in coordination with the data control register; and
a comparator for comparison of data input to said data input ports of each array within the set of arrays from the data control register with data output from the data output ports of each array within the set of arrays.

8. The built-in on-chip test system of claim 7 further comprising:
a memory array for storing a plurality of microcode control vectors, each vector including a data control register field, an address control register field, the microcode pointer control register field and a read/write enable control field; and
a microcode pointer control register and finite state machine for means controlling said address control register, the data control register and the microcode pointer control register in response to the plurality of microcode control vectors and to an overflow feedback state of said data control register and said address control register.

9. The built-in on-chip test system of claim 1, wherein the test logic is a plurality of array built in self test engines.

10. The built-in on-chip test system of claim 1, wherein the set of arrays are a set of random access memories.

11. A method for testing a plurality of arrays on a processor with an on a built in self test engine on the processor, the method comprising:
selecting a subset of the plurality of arrays for testing;

sending data patterns corresponding to the subset of the plurality of arrays from the on chip built in self test engine to the plurality arrays on the processor;

receiving a response at the on chip built in self test engine from the plurality of arrays; and comparing the response from the plurality of arrays to an expected response using the on chip built in self test engine.

12. The method of claim 11, wherein the step of selecting comprises:

disabling write operations for unselected arrays within the plurality of arrays.

13. The method of claim 11, wherein the plurality of arrays includes data output ports and wherein the step of selecting comprises:

disabling capturing the contents of data output ports for unselected arrays within the plurality of arrays.

14. The method of claim 11, wherein the on chip built in self test engine includes comparison logic to compare the response from the plurality arrays to an expected response and wherein the step of selecting comprises:

preventing a comparison of a response from an output data port of an unselected array within the plurality of arrays to the expected response.

15. The method of claim 11, wherein a common signal is used to select the subset of arrays.

16. An apparatus for testing a plurality of arrays on a processor with an on chip built in self test engine on the processor, the apparatus comprising:

selecting means for selecting a subset of the plurality of arrays for testing;

sending means for sending data patterns corresponding to the subset of the plurality of arrays from the on chip built in self test engine to the plurality of arrays on the processor;

receiving means for receiving a response at the on chip built in self test engine from the plurality of arrays; and comparing means for comparing the response from the plurality of arrays to an expected response using the on chip built in self test engine.

17. The apparatus of claim 16, wherein the selecting means comprises:

disabling means for disabling write operations for unselected arrays within the plurality of arrays.

18. The apparatus of claim 16, wherein the plurality of arrays includes data output ports and wherein the selecting means comprises:

disabling means for disabling capturing the contents of data output ports for unselected arrays within the plurality of arrays.

19. The apparatus of claim 16, wherein the on chip built in self test engine includes comparison logic to compare the response from the plurality arrays to an expected response and wherein the selecting means comprises:

preventing means for preventing a comparison of a response from an output data port of an unselected array within the plurality of arrays to the expected response.

20. The apparatus of claim 16, wherein a common signal is used to select the subset of arrays.

21. A computer program product in a computer readable medium for testing a plurality of arrays on a processor with an on chip built in self test engine on the processor, the computer program product comprising:

first instructions for selecting a subset of the plurality of arrays for testing;

second instructions for sending data patterns corresponding to the subset of the plurality of arrays from the on chip built in self test engine to the plurality of arrays on the processor;

third instructions for receiving a response at the on chip built in self test engine from the plurality of arrays; and fourth instructions for comparing the response from the plurality of arrays to an expected response using the on chip built in self test engine.

* * * * *